United States Patent [19]
Olsen et al.

[11] Patent Number: 5,189,628
[45] Date of Patent: Feb. 23, 1993

[54] SYSTEM AND METHOD FOR PARTITIONING PLA PRODUCT TERMS INTO DISTINCT LOGICAL GROUPS

[75] Inventors: Glenn A. Olsen, Colorado Springs, Colo.; Chong-Ming Lee, Singapore, Singapore; Michael T. Yeager, Sunnyvale; Scott K. Pickett, Los Gatos, both of Calif.

[73] Assignee: National Semiconductor Corporation, Santa Clara, Calif.

[21] Appl. No.: 667,571

[22] Filed: Mar. 11, 1991

[51] Int. Cl.$^5$ ................... G06F 15/60; H03K 19/177
[52] U.S. Cl. .................................. 364/489; 364/488; 364/716; 307/465
[58] Field of Search ............... 364/491, 490, 489, 488, 364/716; 395/775, 800; 307/465

[56] References Cited

U.S. PATENT DOCUMENTS

| | | | |
|---|---|---|---|
| 3,949,370 | 4/1976 | Reyling, Jr. et al. | 364/716 |
| 4,903,223 | 2/1990 | Norman et al. | 364/716 |
| 4,942,319 | 7/1990 | Pickett et al. | 307/465 |
| 5,021,690 | 6/1991 | Linz | 364/716 |
| 5,043,879 | 8/1991 | Concha et al. | 395/775 |
| 5,081,375 | 1/1992 | Pickett et al. | 307/465 |

*Primary Examiner*—Vincent N. Trans
*Attorney, Agent, or Firm*—Flehr, Hohbach, Test, Albritton & Herbert

[57] ABSTRACT

A PLA programming system includes software routines for automatically partitioning a specified set of PLA product terms into independent partitions. Each PLA product term specifies values for a set of binary input signals, and values for a set of binary output signals. Some of the output signals are feedback signals also used as input signals. A partitioning merit value is generated for each feedback signal, and then one or more of the feedback signals are selected as target bits in accordance with the generated merit values. Then the specified set of PLA product terms are divided into partitions in accordance with the values of the input signals corresponding to the target bits. All of the PLA product terms in each partition of PLA product terms have identical input signal values corresponding to the target bits, and PLA product terms in different ones of the partitions have different input signal values corresponding to the target bits. When the partitioning process fails to generate partitions containing no more than a predefined number of PLA product terms, an extra feedback signal is added to the input and output signal list of every PLA product term. The extra input and output signals are assigned binary values such that the added feedback signal will be a good target bit for partitioning the PLA product terms, and then process of selecting target bits and partitioning the PLA product terms is repeated.

16 Claims, 4 Drawing Sheets

SYSTEM AND METHOD FOR PARTITIONING PLA PRODUCT TERMS INTO DISTINCT LOGICAL GROUPS

The present invention relates generally to programmable logic devices and particularly to methods and systems for partitioning large sets of programmable logic product terms and partitioning those terms into groups of product terms which require simultaneous evaluation.

BACKGROUND OF THE INVENTION

The problem addressed by the present invention is how to "partition" a large set of product terms (sometimes referred to herein as logic terms) into subsets, herein called partitions. Each partition must not have more than a predetermined number of product/logic terms, so that it fits into a particular programmable logic array (PLA) device or into a "page" of a high density PLA. Furthermore, only one partition may be active or enabled at any one time. This means that the logic terms must be partitioned in such a way that only one partition or subset of logic terms needs to be evaluated during each clock cycle of the circuit.

Referring to FIGS. 1-4, in order to appreciate the problem addressed by the present invention, and its solution, we will first discuss the program logic array (PLA) circuitry typically used to implement large sets of logic terms, and the types of systems in which these PLA circuits are typically used.

Initially, programmable logic devices (PLDs) were used primarily for integrating multiple logic gate circuits into a single package, thereby reducing the number of parts used and the cost of manufacturing a particular circuit. Over time, high density PLDs were designed to integrate ever larger sets of logic functions onto a single chip. Effectively, one high density PLD takes the place of several lower density PLDs.

A well known problem associated with high density PLDs is their high power consumption. One solution to that problem introduced by National Semiconductor was to provide a family of PLD devices known as Multiple Array Programmable Logic (MAPL) devices, examples of which are the MAPL128 and MAPL144. The circuit data sheet for the MAPL128 and MAPL144 is published by National Semiconductor Corporation and is hereby incorporated by reference as background information. Also incorporated by reference is U.S. Pat. No. 4,942,319, which describes the internal operation of the MAPL devices.

Referring to FIG. 1, each MAPL device 100 contains multiple "pages" or partitions 102 of programmable logic circuits, each of which is functionally equivalent to a smaller PLD circuit. The MAPL device 100 also includes an array 110 of clocked registers 112 which generate binary output signals, a subset (S0-S2) of which are used as feedback signals by gates in the circuit pages.

The key feature of the MAPL device 100 is that only one page is enabled at one time. In particular, a subset of the register output signals determine which page 102 of the device 100 will be active during the next clock cycle of the device's master clock CLK. For instance, if the device 100 has eight pages 102, then three binary output signals will be used to determine which page is active. Since only one page 102 of the device is active at any one time, power consumption is reduced dramatically, thereby solving the problem associated with high density PLDs.

The operation of the MAPL device 100 is as follows. During each clock cycle, the currently enabled page "evaluates" specified logical combinations of the input signals and feedback signals, generating binary signals that are sent to the inputs of various ones of the registers 112. At the end of the clock cycle, the generated binary signals are latched into the registers. The outputs of the page selection registers S0-S2 determined which page 102 of the device will be enabled during the next clock cycle.

FIG. 2 shows a circuit 140, comprising eight interconnected programmable logic array (PLA) circuits 142, which is equivalent to the circuit in the MAPL device 100 shown in FIG. 1. Each PLA circuit 142 is enabled when the input to its output enable (OE) port is active. Furthermore, each PLA circuit has internal clocked registers (not shown) which generate its output signals. The outputs of the eight PLA circuits are wire-ORed together, which is possible because at any one time only one of the eight PLA circuits will be active. In any case, three of the output signals from the PLAs are used as feedback signals 143 that are decoded by eight AND gates 144, each with its output coupled to one of the PLA circuit's output enable ports, to determine which one of the eight PLA circuits will be active during each clock cycle.

The MAPL device 100 is particularly cost effective for implementing finite state machine circuits, including controllers, microinstruction sequences and other synchronous logic designs. FIG. 3 shows an example of a state diagram 160 for a finite state machine having eight states ST0 to ST7. The value on the vectors between states show the value of three binary signals required to change the state of the finite state machine from one state to another. To implement this state diagram with the circuitry of FIG. 1, each page 102 of the MAPL circuit is set up to evaluate the circuit's input signals while the state machine is in a corresponding state. Thus each page 102 corresponds to one of the states STx in FIG. 3. Similarly, using the circuit in FIG. 2, each state STx would correspond to one of the PLA circuits 142.

Referring to FIG. 4, there is shown a simplified representation of the circuitry in one of the PLA circuits 142 of FIG. 2. An example of a corresponding PLA specification for the product terms of this circuit is shown in Table 1.

TABLE 1

| .inputs: | I1 | I2 | I3 | F1 | F2 | F3 | F4 |
|---|---|---|---|---|---|---|---|
| .outputs: | O1 | O2 | O3 | O4 | F1 | F2 | F3 | F4 |
| product terms: | | | | | | | |
| | inputs | outputs | | | | | |
| 1) | 0001000 | 10001001 | | | | | |
| 2) | 0011000 | 10101011 | | | | | |
| 3) | 1-110-1 | 11111001 | | | | | |
| 4) | 1-01001 | 00001000 | | | | | |
| 5) | 0101010 | 01011000 | | | | | |
| ... | ... | ... | | | | | |

This PLA specification lists three input signals (I1-I3), four output signals (O1-O4) and four feedback signals (F1-F4). Note that the feedback signals are included in both the input signal list and in the output signal list. Each product term in the PLA specification comprises a set of seven binary input values, three for the input signals and four for the feedback signals, and eight corresponding binary output values. A dash "-" represents a "don't care" value, meaning that it can be either a "1" or a "0".

Each AND gate 170 in FIG. 4 represents the input signal specification of one product term in the PLA specification. A first programmable connection matrix 172 connects input and feedback signals to each AND gate 170 in accordance with the input signal list of a corresponding product term in the PLA specification. In particular, on the input side of each PLA product, a "1" indicates that the corresponding input signal is to be connected to a corresponding AND gate. "0" and "-" values indicate that an input signal is not to be connected to the AND gate.

A second programmable connection matrix 174 connects the outputs of the AND gates to a set of OR gates 176 so as to match the values in the output portions of the specified product terms. On the output side of each PLA product term, a "1" indicates that the corresponding product term (i.e., the output of the corresponding AND gate) is to be connected to the OR gate for the corresponding output signal, while a "0" or "-" indicates no connection. The outputs from each OR gate 176 is latched in a corresponding register 178 at the end of each clock cycle.

An output enable signal OE is used to enable and disable the connection matrices 172 and 174 and the register circuits 178. When OE is not enabled, the circuit 142 dissipates very little power because no signals internal to the circuit are changing in value.

In the context of FIG. 1, each page 102 contains a connection matrix and a set of AND gates corresponding to the connection matrix 172 and AND gates 170 in FIG. 4. The array 110 of clocked registers 112 in FIG. 1 corresponds to the second connection matrix 174, OR gates 176 and registers 178 in FIG. 4.

Returning now to the problem addressed by the present invention, consider the situation in which a PLA specification contains more product terms than the number of AND gates in one page 102 of the MAPL circuit 100. Equivalently, in the context of the multiple PLA circuit shown in FIG. 2, the PLA specification contains more product terms than the number of AND gates in any one PLA circuit 142. The problem is to devise an automated system that partitions the product terms into subsets, herein called partitions, each no larger than one page 102, in such a way that only one partition needs to be enabled during each clock cycle.

For many circuits, such as finite state machines, the partitions are obvious to the circuit designer. In these situations the circuit designer will specify which feedback signals define the state of the circuit, eliminating the need for the present invention. However, there are many situations in which a design engineer will be asked to convert a specified synchronous logic circuit into a PLA circuit, without there being any immediately obvious method of dividing the resulting set of product terms into independent partitions. In fact, it is easy to devise circuits which are impossible to partition, simply because all product terms must be evaluated every clock cycle. On the other hand, many if not most sequential logic circuits tend can be partitioned, and the present invention provides an automated system and methodology for performing such partitioning.

SUMMARY OF THE INVENTION

In summary, the present invention is a PLA programming system which includes software routines for automatically partitioning a specified set of PLA product terms into independent partitions. Each PLA product term specifies values for a set of binary input signals, and values for a set of binary output signals. Some of the output signals are feedback signals also used as input signals. A partitioning merit value is generated for each feedback signal, and then one or more of the feedback signals are selected as target bits in accordance with the generated merit values. Then the specified set of PLA product terms are divided into partitions in accordance with the values of the input signals corresponding to the target bits. All of the PLA product terms in each partition of PLA product terms have identical input signal values corresponding to the target bits, and PLA product terms in different ones of the partitions have different input signal values corresponding to the target bits.

During partitioning, a copy of each PLA product term having a "don't care" input signal value corresponding to one of the target bits is generated for each partitioned subset of PLA product terms. Then the "don't care" input signal value in each copy of the copied PLA product term is replaced with a binary value equal to the value specified for that input signal in all of the other PLA product terms in the same partitioned subset of PLA product terms.

When the partitioning process fails to generate partitions containing no more than a predefined number of PLA product terms, an extra feedback signal is added to the input and output signal list of every PLA product term. The extra input and output signals are assigned binary values such that the added feedback signal will be a good target bit for partitioning the PLA product terms, and then process of selecting target bits and partitioning the PLA product terms is repeated.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 5:
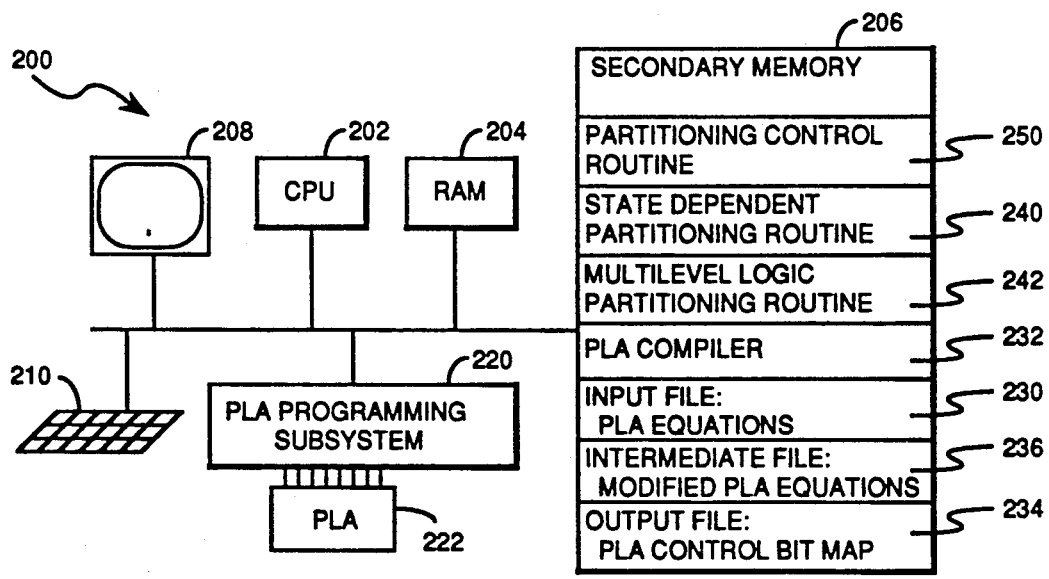
FIG. 5 is a block diagram of a PLA programming system in accordance with the present invention.

Referring to FIG. 5, there is shown a PLA programming system 200 in accordance with the present invention. The PLA programming system 200 includes standard microcomputer components, including a central processing unit 202, primary random access memory 204, secondary memory 206, and a user interface including a display 208 and keyboard 210. In addition, it has a PLA programming subsystem 220 for programming PLA devices by loading a PLA control bit map into a PLA device 222.

Figure 1:
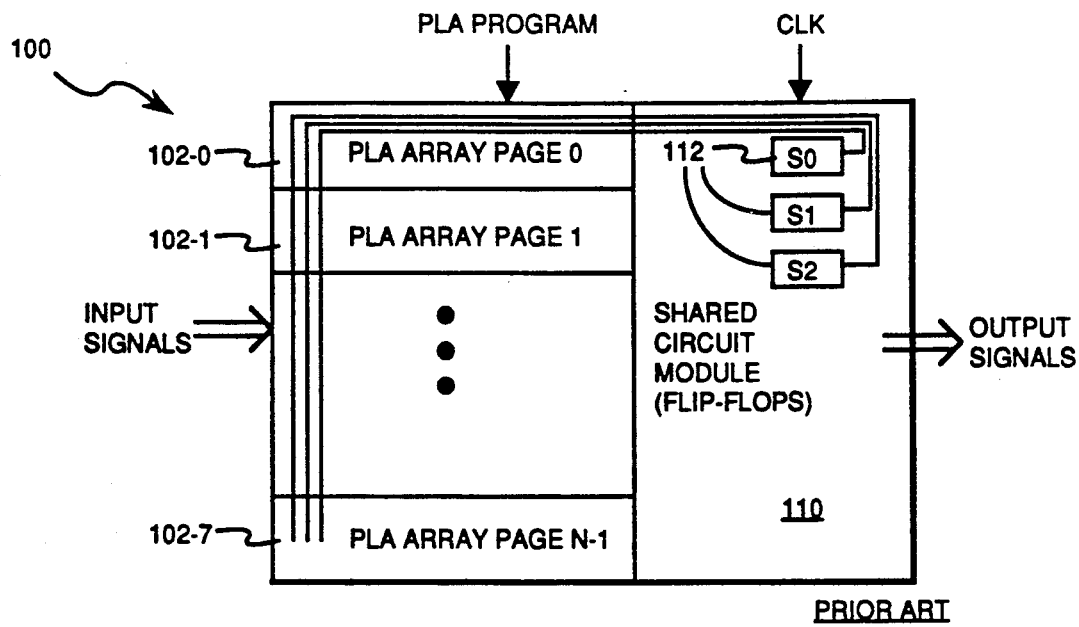
FIG. 1 depicts the internal structure of a Multiple Array Programmable Logic device.

Secondary memory 206 stores the list of PLA product terms 230, also called PLA equations, entered by the system's user, typically in the form of a disk file. Typically, that list of PLA equations 230 is compiled by a PLA compiler 232 into a PLA control bit map 234 that is suitable for loading into a particular type of PLA device. Since many such PLA compiler programs are commercially available, the operation of such programs is not discussed further. When using a MAPL device (see above discussion with regard to FIGS. 1-3), the list of PLA equations 230 typically includes data denoting a set of feedback signal names which select what page is currently enabled. For a MAPL device with eight pages, there are up to three such feedback signals. Given a specified set of partitioning feedback signals, the list of PLA product terms is partitioned by (A) assigning to each page of the MAPL device a distinct set of binary values for the partitioning feedback signals, and then (B) assigning to each page those product terms whose "input" partitioning feedback signals have matching values. If any of the partitioning feedback signals in a product term have a value of "don't care" (denoted by a "-" in Table 1), that product term is duplicated with the partitioning feedback signal in one copy being assigned the value "0" and the value "1" in the other copy.

For example, in TABLE 1, F3 and F4 might be used as the partitioning feedback signals. Product terms 1 and 2 would be assigned to page 0, product term 4 would be assigned to page 1, product term 5 would be assigned to page 2 and product term 3 would be duplicated with one copy being assigned to page 1 and one copy be assigned to page 3.

Figure 2:
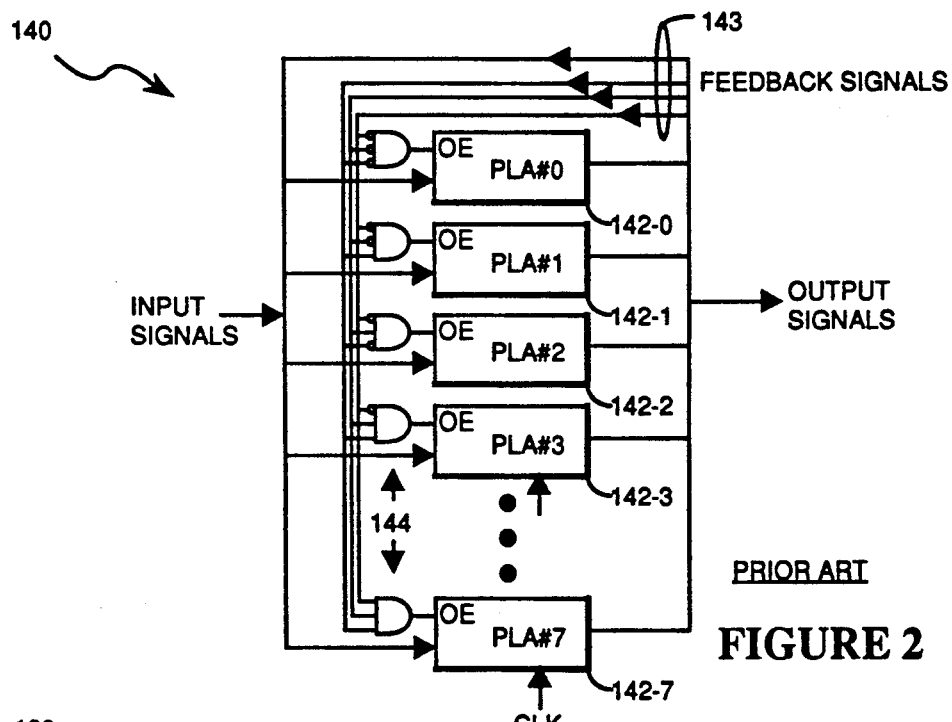
FIG. 2 is a block diagram of a multiple PLA device circuit which is functionally equivalent to the Multiple Array Programmable Logic device of FIG. 1.
Figure 3:
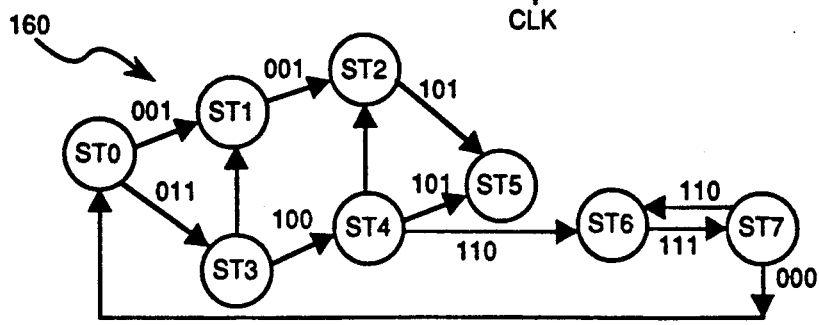
FIG. 3 depicts a state transition diagram for a finite state machine.
Figure 4:
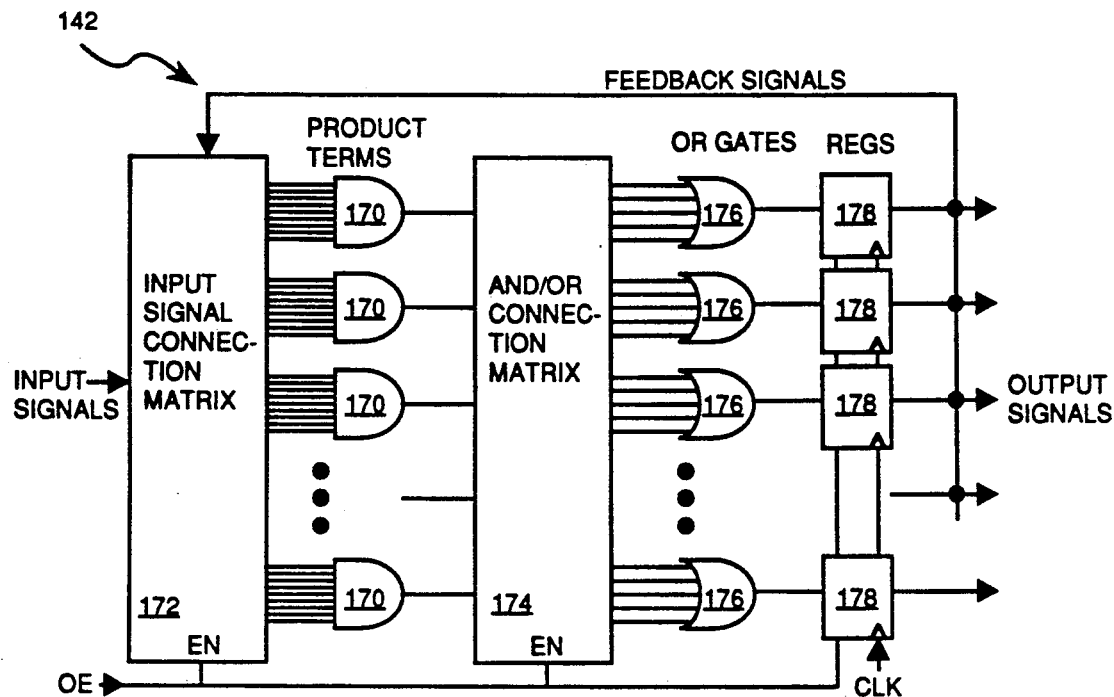
FIG. 4 is a block diagram of the logic circuitry in a PLA device.

However, in the context of the present invention, it is assumed that the file of PLA equations 230 (A) does not list the feedback signals to be used for partitioning the PLA product terms, and (B) either contains too many product terms to fit into one page of the MAPL device being used or contains too many product terms to fit into one PLA device if a system along the lines of FIG. 2 is being used. Thus, if one tried to compile such a file of PLA equations, the PLA compiler 232 would return an error message saving that the list of PLA product terms cannot be compiled.

The present invention concerns a process for revising an initial list of PLA equations 230 prior to compilation so as to produce a modified input file 236 that contains a modified, partitioned set of PLA equations that can be compiled into a PLA control bit map 234 for use in the MAPL device. In particular, the present invention provides two partitioning methods, embodied in the preferred embodiment as a "state dependent partitioning routine" 240 and a "multiple level logic partitioning routine" 242. These partitioning routines take a set of PLA product terms and partition them into smaller subsets or partitions in such a way that only one partition or subset of logic terms needs to be evaluated during each clock cycle of the circuit.

Figure 6:
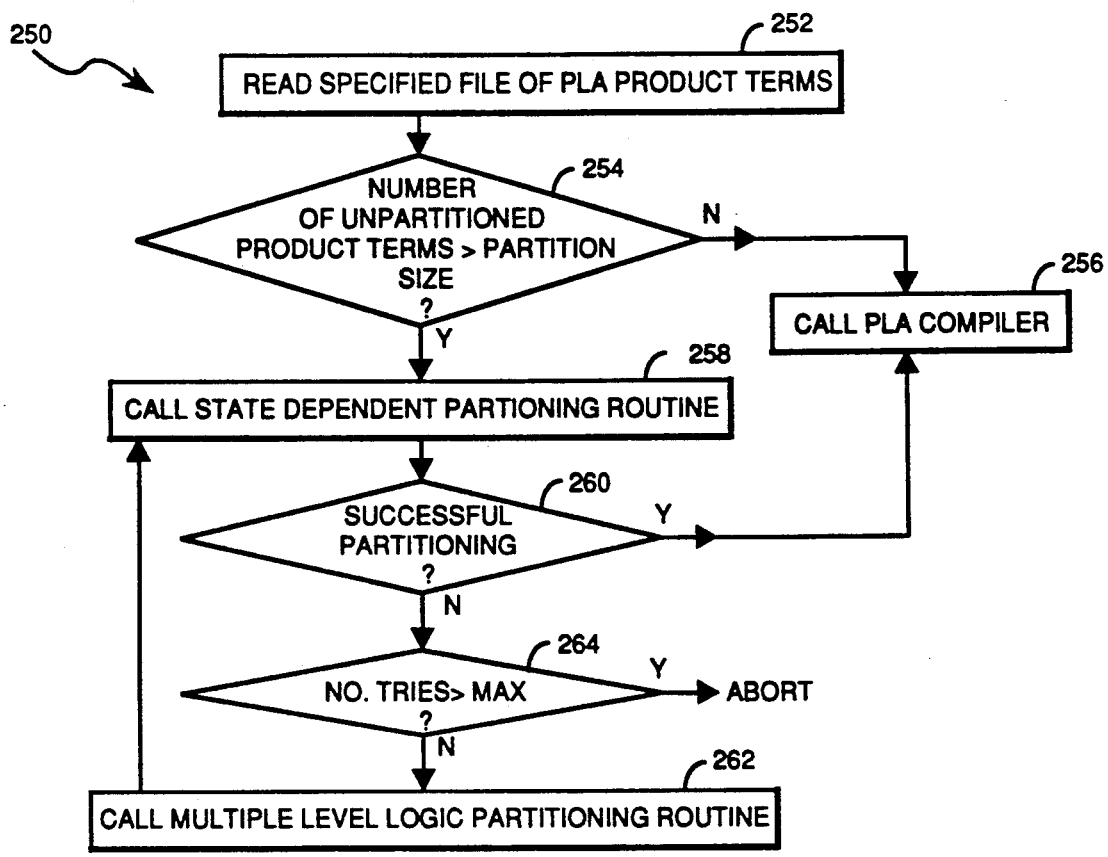
FIG. 6 is a flow chart of the process for partitioning a set of PLA product terms prior to compilation.

Referring to FIG. 6, these two partitioning routines are called by a partitioning control routine 250 which reads a specified file of PLA equations (step 252), and checks to see if partitioning, or further partitioning, is required (step 254) by checking to see if the number of unpartitioned product terms is greater than the maximum allowed partition size. If the specified PLA equations are not partitioned, step 254 checks to see if the number of product terms is greater than the partition size. If the PLA equations are partitioned, hopefully by fewer than the maximum allowed number of partitioning feedback signals, step 254 checks to see if the number of product terms in any partition is greater than the partition size. If the partition size limit is not violated (step 254), then the PLA compiler is called (step 256) and further partitioning is not required.

If the partition size limit is violated (step 254), then the "state dependent partitioning routine" 240 is called (step 258), as described below in more detail with reference to FIG. 7. If the state dependent partitioning routine successfully partitions the PLA product terms (step 260), then the PLA compiler is called (step 256). Otherwise, the "multiple level logic partitioning routine" 242 is called (step 262). As described below in more detail with reference to FIG. 8, the multiple level logic routine adds a new logic level to the circuit being implemented, in the form of a new signal that is added to the input and output columns of every PLA product term. If properly constructed, the added new signal will make it possible to partition the set of PLA product terms when the state dependent partitioning routine is called once again (step 258). This process of adding new feedback signals prior to re-running the state dependent partitioning routine can be repeated two or more times (step 264) prior to aborting the entire partitioning process. In some cases it may be impossible to partition a set of PLA product terms into independent partitions, which simply means that the number of product terms which can be implemented in each page of the MAPL device, or the number of product terms that can be implemented in any one PLA device in the system of FIG. 2, is not sufficient for the circuit being designed.

STATE DEPENDENT PARTITIONING

Figure 7:
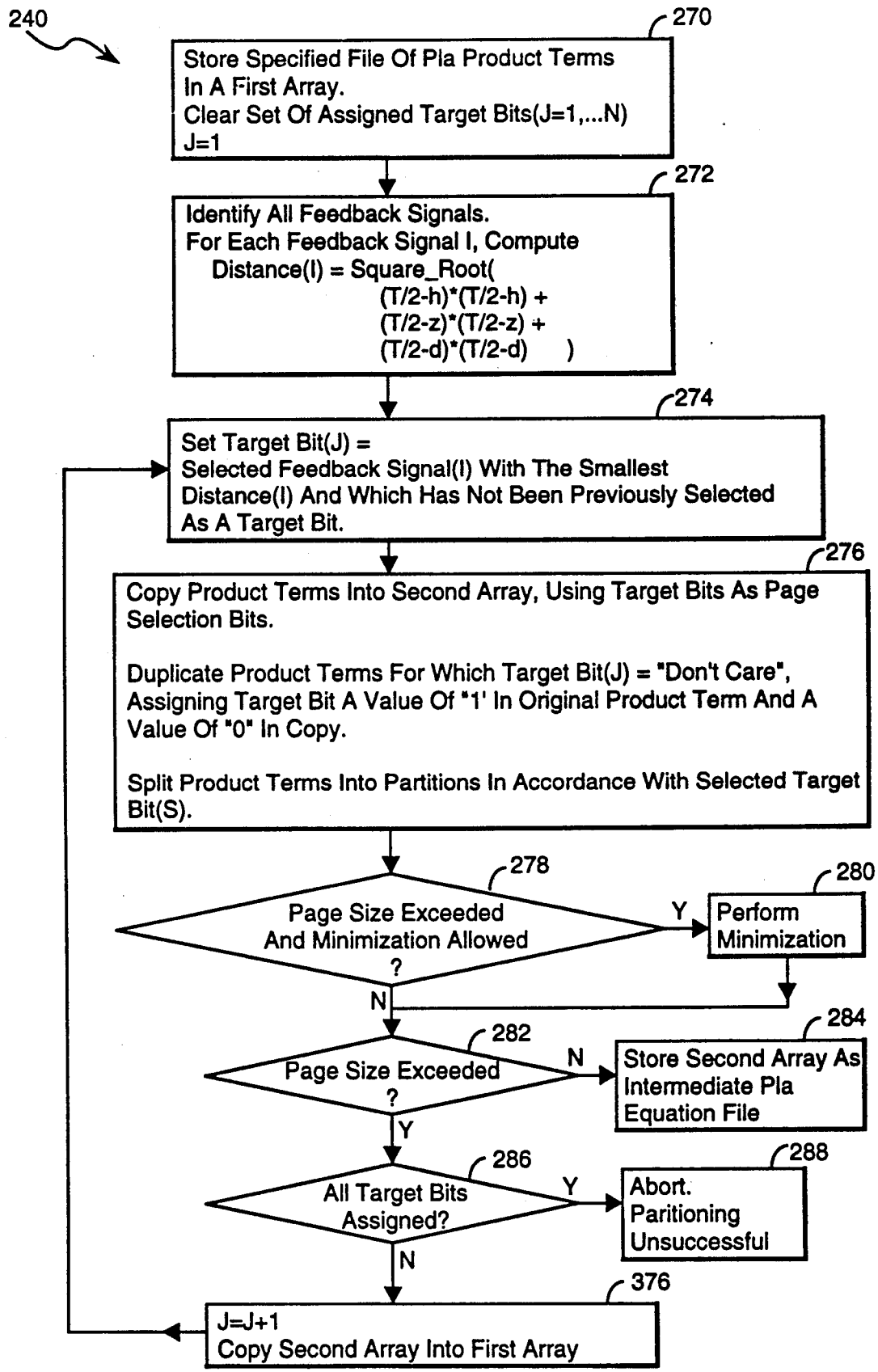
FIG. 7 is a flow chart of a state dependent partitioning routine for partitioning a set of PLA product terms into discrete sets, called partitions.

Referring to FIG. 7, the state dependent partitioning routine works as follows. First, the specified set of PLA product terms is stored in a first array in memory (step 270). Note that for any particular circuit design, there is a known maximum number of partitions into which the PLA product terms can be divided, and thus there is a corresponding known number N which is the maximum number of feedback signals that can be used as page selection bits, where N is equal to the logarithm, base 2, of the maximum allowed number of partitions, rounded up to the next largest integer:

Round_Up $\{\log_2(\text{maximum number of partitions})\}$

Initially, the assignments of all N of the page selection bits, herein called target bits, are cleared (step 270).

Note that we already know from the partitioning control routine that the number of product terms exceeds the number that can be fit into a partition.

At step 272, a "distance" value is computed for all feedback signals in the specified set of PLA equations. The ideal target bit is equal to 1 in the input signal list of half the specified product terms, and is equal to zero in the other half. The computed distance is a value indicating how far each feedback signal is from this ideal:

Distance($I$) = Square Root
$\{(T/2 - H)^2 + (T/2 - Z)^2 + (T/2 - D)^2\}$ where T is the total number of product terms, H is the number of product terms in which signal I, in the input signal list, is equal to 1, Z is the number of product terms in which it equals 0, and D is the number of product terms in which is value is specified as "don't care".

At step 274, the first target bit is assigned to be that feedback signal with the smallest computed Distance value. The reason for this selection is that this feedback signal is most likely to split the specified product terms into approximately equal sized partitions.

Next, at step 276, the product terms are copied into a second array in memory, using the selected target bit(s) as page selection bits. All product terms for which the most recently assigned target bit is equal to "don't care" are duplicated, and that target bit is assigned a value of "1" in the input string of one of the two copies of the duplicated product term, and is assigned a value of "0" in the other. More particularly the "don't care" input signal value in each copy of the copied PLA product term is replaced with a binary value equal to the value specified for that input signal in all of the other PLA product terms in the same partitioned subset of PLA product terms. Then, the product terms in the second array are split into partitions in accordance with the selected target bits. In other words, a separate partition is set up for each possible combination of binary values of the selected target bits, and then each product term is assigned to the partition which matches the target bit values in the product term's input string.

After the partitioning step 276, the number of product terms in each partition is counted and compared with a predefined maximum allowed page size (step 278). If any partition exceeds the allowed page size, and "minimization" is allowed, a product term minimization routine is run on each such partition (step 280).

The minimization routine looks for pairs of product terms that can be combined into a single product term. This is done by comparing each product term in a partition with all other product terms. If any two product terms are identical, except that in one product term an item in the input signal list is equal to "0" while the same input signal list item in the other product term is equal to "1", then the two are combined by deleting one of the two product terms, and replacing the specification for the input signal list item with "don't care". The comparison and combining process is repeated until a complete pass through the product terms results in no product term items being combined.

After running the minimization routine, the partition sizes are once again compared with the maximum allowed page size (step 282). If none of the partitions exceeds the allowed page size, the modified set of PLA product terms in the second array are stored as the intermediate PLA equation file 236 (step 284) and then the partitioning routine exits, returning execution to the partioning control routine. Otherwise, the partitioning routine checks to see if all the available target bits have been assigned (step 286). If so, the attempt to partition the product terms was unsuccessful, and the state dependent partitioning routine aborts (step 288).

On the other hand, if at least one available target bit has not yet been assigned (step 286), the contents of the second array are copied into the first array, and then the partitioning process resumes at step 274, where the next available target bit is assigned to be whichever feedback signal has not yet been assigned to a target bit and has the smallest computed Distance value. Then the product terms are partitioned again using this additional target bit assignment (step 276) and the resulting partition is checked to see if the resulting partitions meet the page sizing requirements (steps 278 to 284).

This process continues until either the partitioning is successful, or until all the target bits are assigned but at least one partition is still too large. Such failures of the state dependent parititioning routine 240 most frequently occur when the terms in the input signal lists contain too many "don't care" values.

EXAMPLE OF STATE DEPENDENT PARTITIONING

Table 2 is a listing of the PLA specification for the product terms of a specified logic circuit. In the PLA specification of Table 2, the feedback signals L3, L2, L1, L0, D2, D1, D1 and A0 are denoted with a ".REG" suffix in the output signal list to indicate that these signals are output by clocked registers. Another way to state this is that the computed values for these signals are transmitted to the data input ports of D-type flip flop registers, which then store the computed values at the end of each clock cycle, with the outputs of the registers being used as input signals for the next clock cycle.

TABLE 2

```
.inputs:   I1 I2 L3 L2 L1 L0 D2 D1 D0 A0
.outputs:  O1 O2 O3 L3.REG L2.REG L1.REG
           L0.REG D2.REG D1.REG D0.REG A0.REG
product terms:
        inputs          outputs
01)   10 0000----0    1-0 0110----1
02)   10 0010----0    1-0 1000----1
03)   10 0011----0    1-0 1001----1
04)   10 0100----0    1-0 1010----1
05)   10 0101----0    1-0 1011----1
06)   10 0110----0    1-0 1100----1
07)   10 0111----0    1-0 1101----1
08)   10 1000----0    1-0 1110----1
09)   10 1001----0    1-0 1111----1
10)   10 1010----0    1-0 1011----1
11)   10 1011----0    0-0 1100----0
12)   10 1100----0    0-0 1101----0
13)   10 1101----0    0-0 1110----0
14)   10 1110----0    0-0 1111----0
15)   10 1111----0    0-0 0000----0
16)   01 --------    -- ----000-
17)   01 ----000-    -00 ----001-
18)   01 ----001-    -00 ----011-
19)   01 ----011-    -00 ----000-
```

Computing the "distance" associated with each of the feedback signals, it can be seen that L3, L2, L1 and L0 have the smallest distance values, with the distance value being equal for all four of these signals. Each has a first value (e.g., "1") in eight product terms, the opposite value in seven product terms, and a don't care value "-" in four product terms. Selecting L3 as the target bit, we get a modified PLA specification, with an additional "page selection" feedback signal P0 that is equal in value to the L3 signal, as shown in Table 3.

TABLE 3

```
.inputs:   I1 I2 L3 L2 L1 L0 D2 D1 D0 A0 P0
.outputs:  O1 O2 O3 L3.REG L2.REG L1.REG
           L0.REG D2.REG D1.REG D0.REG A0.REG
           P0.REG
           product terms:
                inputs           outputs
ARRAY #1  01)   10 0000----0 0   1-0 0110----1 0
          02)   10 0010----0 0   1-0 1000----1 1
          03)   10 0011----0 0   1-0 1001----1 1
          04)   10 0100----0 0   1-0 1010----1 1
          05)   10 0101----0 0   1-0 1011----1 1
          06)   10 0110----0 0   1-0 1100----1 1
          07)   10 0111----0 0   1-0 1101----1 1
```

TABLE 3-continued

|  | | | |
|---|---|---|---|
| | 16') | 01 0-------- 0 | -- ----000- 0 |
| | 17') | 01 0---000- 0 | -00 ----001- 0 |
| | 18') | 01 0---001- 0 | -00 ----011- 0 |
| | 19') | 01 0----011- 0 | -00 ----000- 0 |
| ARRAY #2 | 08) | 10 1000---0 1 | 1-0 1110---1 1 |
| | 09) | 10 1001---0 1 | 1-0 1111---1 1 |
| | 10) | 10 1010---0 1 | 1-0 1011---1 1 |
| | 11) | 10 1011----0 1 | 0-0 1100----0 1 |
| | 12) | 10 1100---0 1 | 0-0 1101---0 1 |
| | 13) | 10 1101---0 1 | 0-0 1110---0 1 |
| | 14) | 10 1110----0 1 | 0-0 1111----0 1 |
| | 15) | 10 1111----0 1 | 0-0 0000----0 0 |
| | 16") | 01 1-------- 1 | -- ----000- 0 |
| | 17") | 01 1----000- 1 | -00 ----001- 0 |
| | 18") | 01 1----001- 1 | -00 ----011- 0 |
| | 19") | 01 1----011- 1 | -00 ----000- 0 |

MULTIPLE LEVEL LOGIC PARTITIONING

In some cases, the above described state dependent partitioning routine 240 fails to fit a PLA specification into a given MAPL device. One reason that the state dependent partitioning routine 240 may fail is that many of the product terms have a value of "don't care" for the selected target bit(s), which causes those product terms to be expanded with the target bit overwritten with a "0" and "1". This increases the number of product terms in the PLA specification, increasing the chance that the PLA table won't fit into the MAPL device.

The primary function of the multiple level partitioning routine 242 is to add an extra logic term (XLT) to the specified PLA product terms, which in turn can be assigned as the page selection (or target) bit by the state dependent partitioning routine 240.

Figure 8:
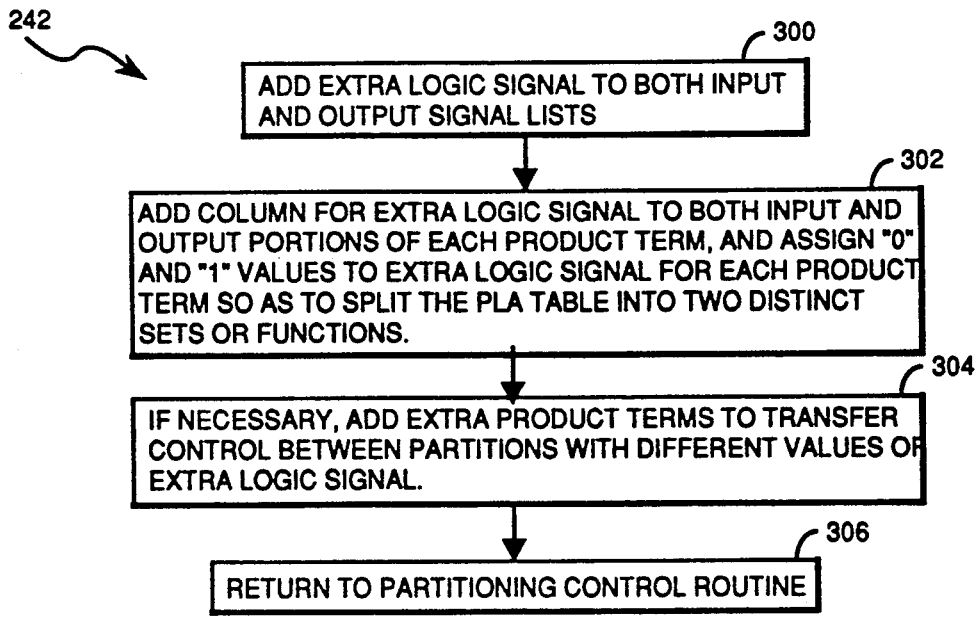
FIG. 8 is a flow chart of a multilevel logic partitioning routine for partitioning a set of PLA product terms into partitions.

Referring to FIG. 8, the multiple level partitioning routine 242 adds an extra feedback logic signal (XLT) to both the input signal list and the output signal lists of each product term in the PLA equations (step 302). Then corresponding columns are added to both the input and output signals of each product term, and "0" and "1" values are assigned to each added input and output signal in the table of product terms so as to split the PLA table of product terms into two distinct sets of functions.

One method of determining what values should be assigned to the extra logic signal XLT in each product term's input and output signal lists is to identify a non-feedback input signal, or a logical combination of two non-feedback input signals which, if used as a page selection bit, would partition the specified PLA product terms most evenly. This can be done by using the same distance computation and selection steps as in steps 272-274 of FIG. 7, except that the computation is now done for input signals and combinations (such as A AND B, A OR B, AB="01", etc.) of two logic signals. Once a best input signal or combination of input signals is identified, the value of the selected input signal is replicated in the XLT input signal column, and values are assigned to the XLT output signal column in accordance with which partition will need to be evaluated at the next clock cycle.

Finally, when necessary, one or two extra product terms are added for transferring control from one partition to the other (step 304). For example, if input signal I1 has been used as the basic of creating the XLT feedback signal, one or two extra product terms will be needed, unless it is known that the XLT feedback signal from one clock cycle will always be equal to the I1 input signal during the next clock cycle. In other words, if the PLA circuit can always predict when I1 will change from a 0 to 1, and vice versa, there is no need for extra product terms. Otherwise, there needs to be at least one product term with input I1=1 and input XLT=0 that generates an XLT.REG output value of 1, and there needs to be at least one product term with input I1=0 and input XLT=1 that generates an XLT.REG output value of 0, so as to transfer control between the XLT=1 and XLT=0 partitions. Thus, at step 304, the routine checks whether the existing product terms already include terms which perform such control transfers, and if not, adds the required product terms.

The resulting modified set of PLA equations is then passed back to the control routine 250 (see FIG. 6) for another run through the state dependent partitioning routine (step 306). Since the extra logic term has all the markings of an ideal target bit (even distribution of "1" and "0" values, with few or no "don't care" values), partitioning by the state dependent partitioning routine 240 should be improved.

It is important to note that adding an extra logic term to a set of PLA product terms may add a level of logic, and thus a time delay to the resulting circuit. In other words, a one clock cycle delay may be added to the circuit whenever a transition from one partition to the other is performed by a product term that was added by the partitioning routine at step 304. The circuit designer must check the resulting PLA circuit to ensure that the outputs generated by this partitioning do not need to be evaluated at the same time. In some cases it will be necessary for the circuit designer to specify sets of output signals which need to be evaluated at the same time so as to prevent improper partitioning.

EXAMPLE OF MULTIPLE LEVEL LOGIC PARTITIONING

Table 4 is a listing of the PLA specification for the product terms of a specified logic circuit. Note that the symbol "!" for an output signal means that the previous value of the output signal is inverted.

With the addition of an extra logic term, herein called PG, the modified PLA specification is shown in Table 5. As can be seen in Table 5, product term 01 is used to transfer control from page 0 to page 1 whenever page 0 is active and TX=0. Added product term 41 is used to transfer control from page 1 to page 0 whenever page 1 is active and TX=1.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

TABLE 4

| inputs: | TX AK FS P12 P11 P10 P9 P8 P7 P6 P5 P4 P3 P2 P1 P0 PC MR CI |
|---|---|
| outputs: | P12.REG P11.REG P10.REG P9.REG P8.REG P7.REG P6.REG P5.REG P4.REG P3.REG P2.REG P2.REG P1.REG P0.REG PC.REG MR.REG MF IR CI.REG | product terms:

| | inputs | outputs |
|---|---|---|
| 01) | 0-- -------------- --0 | ---- ----0 |
| 02) | 11- -------------0 --0 | ----------!- -1110 |
| 03) | 11- -----------00 --0 | -----------!-- -1110 |
| 04) | 11- ----------000 --0 | ----------!---- -1110 |
| 05) | 11- ---------0000 --0 | ---------!----- -1110 |

TABLE 4-continued

```
06) 11- --------00000 --0 --------!------ -1110
07) 11- -------000000 --0 -------!------- -1110
08) 11- ------0000000 --0 ------!-------- ---0
09) 11- -----00000000 --0 -----!--------- ---11
10) 11- ----000000000 --0 ----!---------- ---11
11) 11- ---0000000000 --0 ---!----------- ---11
12) 11- --00000000000 --0 --!------------ ---11
13) 11- -000000000000 --0 !--------------- ---11
14) 1-- ----1--------- -11 ---------------- -11-0
15) 1-- ---1---------- -11 ---------------- -11-0
16) 1-- --1----------- -11 ---------------- -11-0
17) 1-- -1------------ -11 ---------------- -11-0
18) 1-- 1-------------- -11 ---------------- -11-0
19) 11- -------------- -01 ---------------- -11-0
20) -1- -------------- -10 ---------------- -11-0
21) --1 1------------- ---1 ---------------- ---10
22) --1 -1------------ ---1 ---------------- ---10
23) --1 --1----------- ---1 ---------------- ---10
24) --1 ---1---------- ---1 ---------------- ---10
25) --- ----1--------- ---1 ---------------- ---10
26) --- -------------- ---0 ---------------- ---10
27) -0- -------------- ---0 ---------------- ---10
28) 0-- -------------- 1-0 ---------------- 1 1---0
29) 0-- -------------- 1- -0 ---------------- -1- ----0
30) 0-- ------------1-- -0 ---------------- 1-- ----0
31) 0-- -----------1--- -0 ---------------- 1--- ----0
32) 0-- ----------1---- -0 ---------------- 1---- ----0
33) 0-- ---------1----- -0 ---------------- 1----- ----0
34) 0-- --------1------ -0 ---------------- 1------ ----0
35) 0-- -------1------- -0 ---------------- 1------- ----0
36) 0-- ------1-------- -0 ----1---------- ----0
37) 0-- -----1--------- -0 ---1----------- ----0
38) 0-- ----1---------- -0 --1------------ ----0
39) 0-- ---1----------- -0 -1------------- ----0
40) 0-- --1------------ -0 1-------------- ----0
```

TABLE 5

```
.inputs:   TX AK FS P12 P11 P10 P9 P8 P7 P6 P5 P4 P3 P2
           P1 P0 PC MR CI PG
.outputs:  P12.REG P11.REG P10.REG P9.REG P8.REG
           P7.REG P6.REG P5.REG P4.REG P3.REG P2.REG
           P2.REG P1.REG P0.REG PC.REG MR.REG MF
           IR CI.REG PG.REG
product terms:
    inputs                        outputs
01) 0-- -------------- --00       -------------- ----01
02) 11- -------------0 --00       -----------!-- -11100
03) 11- ------------00 --00       ----------!--- -11100
04) 11- -----------000 --00       ---------!---- -11100
05) 11- ----------0000 --00       --------!----- -11100
06) 11- ---------00000 --00       -------!------ -11100
07) 11- --------000000 --00       ------!------- -11100
08) 11- -------0000000 --00       -----!-------- ---00
09) 11- ------00000000 --00       ----!--------- ---110
10) 11- -----000000000 --00       ---!---------- ---110
11) 11- ----0000000000 --00       --!----------- ---110
12) 11- ---00000000000 --00       -!------------ ---110
13) 11- --000000000000 --00       !-------------- ---110
14) 1-- ----1--------- -110       --------------- -11-00
15) 1-- ---1---------- -110       --------------- -11-00
16) 1-- --1----------- -110       --------------- -11-00
17) 1-- -1------------ -110       --------------- -11-00
18) 1-- 1-------------- -110      --------------- -11-00
19) 11- -------------- -010       --------------- -11-00
20) -1- -------------- -100       --------------- -11-00
21) --1 1------------- ---10      --------------- ----100
22) --1 -1------------ ---10      --------------- ----100
23) --1 --1----------- ---10      --------------- ----100
24) --1 ---1---------- ---10      --------------- ----100
25) --- ----1--------- ---10      --------------- ----100
26) --- -------------- ---00      --------------- ----100
27) -0- -------------- ---00      --------------- ----100
28) 0-- -------------- 1-01       --------------- 1 1---01
29) 0-- ------------1-- --01      --------------- -1- ----01
30) 0-- -----------1--- --01      --------------- 1-- ----01
31) 0-- ----------1---- --01      --------------- 1--- ----01
32) 0-- ---------1----- --01      --------------- 1---- ----01
33) 0-- --------1------ --01      --------------- 1----- ----01
34) 0-- -------1------- --01      --------------- 1------ ----01
35) 0-- ------1-------- --01      -----1--------- ----01
```

TABLE 5-continued

```
36) 0-- -----1--------- --01      ----1---------- ----01
37) 0-- ----1---------- --01      ---1----------- ----01
38) 0-- ---1----------- --01      --1------------ ----01
39) 0-- --1------------ --01      -1------------- ----01
40) 0-- 1--------------- --01     1--------------- ----01
41) 1-- -------------- --01       --------------- ----00
```

What is claimed is:

1. A method of operating a computer system to program at least one programmable logic device in accordance with a specified set of PLA product terms, the steps of the method performed by said computer system comprising:

receiving and storing in a computer storage means a specified set of PLA product terms, each PLA product term specifying values for a specified set of binary input signals, and specifying values for a specified set of binary output signals, wherein a subset of said binary output signals are feedback signals used as corresponding ones of said binary input signals;

evaluating at least a subset of said feedback signals with respect to predefined criteria and generating a corresponding merit value for each of said feedback signals;

selecting at least one of said feedback signals in accordance with said generated merit values; and partitioning into partitioned subsets said set of PLA product terms in accordance with said specified values of the binary input signals which correspond to said selected feedback signals; wherein all of said PLA product terms in each said partitioned subset of PLA product terms have identical input signal values corresponding to said selected feedback signals, and said PLA product terms in different ones of said partitioned subsets have different input signal values corresponding to said selected feedback signals; and storing control signals, corresponding to said partitioned subsets of PLA product terms, in at least one programmable logic device.

2. The method of claim 1, wherein said selecting and partitioning steps are repeatedly performed by said computer system until none of said partitioned subsets of PLA product terms contains more than a predefined number of PLA product terms.

3. The method of claim 1, wherein each said specified input signal value has a specified value selected from the set consisting of "1", "0" and "don't care"; and said partitioning step includes the steps of (A) generating for each said partitioned subset a copy of each said PLA product term having an input signal value corresponding to one of said selected feedback signals which input signal value is specified to be equal to "don't care", and (B) replacing said specified "don't care" input signal value in each said copy of said copied PLA product term with a binary value equal to the value specified for said input signal in all of the other PLA product terms in the same partitioned subset of PLA product terms.

4. The method of claim 1, wherein each said specified input signal value in said specified set of PLA product terms has a specified value selected from the set consisting of "1", "0" and "don't care";

said merit value generated by said evaluating step for each evaluated feedback signal corresponds to $$(T/2-H)^2+(T/2-Z)^2+(T/2-D)^2$$

where T is the total number of specified product terms, H is the number of said PLA product terms in which an input signal comprising the evaluated feedback signal equals "1", Z is the number of said PLA product terms in which an input signal comprising the evaluated feedback signal equals "0", and D is the number of said PLA product terms in which an input signal comprising the evaluated feedback signal is specified as "don't care".

5. A method of operating a computer system to program at least one programmable logic device in accordance with a specified set of PLA product terms, the steps of the method performed by said computer system comprising:

receiving and storing in a computer storage means a specified set of PLA product terms, each PLA product term specifying values for a specified set of binary input signals, and specifying values for a specified set of binary output signals, wherein a subset of said binary output signals are feedback signals used as corresponding ones of said binary input signals;

evaluating at least a subset of said feedback signals with respect to predefined criteria and generating a corresponding merit value for each of said feedback signals;

selecting at least one of said feedback signals in accordance with said generated merit values;

partitioning into partitioned subsets said set of PLA product terms in accordance with said specified values of the binary input signals which correspond to said selected feedback signals; wherein all of said PLA product terms in each said partitioned subset of PLA product terms have identical input signal values corresponding to said selected feedback signals, and said PLA product terms in different ones of said partitioned subsets have different input signal values corresponding to said selected feedback signals;

determining when said selecting and partitioning steps fail to generate partitioned subsets of PLA product terms containing more than a predefined number of PLA product terms;

when said determination is made,
adding an extra feedback signal to every one of said PLA product terms, including specifying an extra input signal value and an extra output signal value in every one of said PLA product terms; said specified extra input signal values and output signal values comprising binary values; and
then repeating said selecting and partitioning steps, wherein one of said feedback signals selected by said selecting step is said extra feedback signal; and storing control signals, corresponding to said partitioned subsets of PLA product terms, in at least one programmable logic device.

6. The method of claim 5, said adding step including the step of adding to said specified set of PLA product terms at least one additional PLA product term for changing the value of said extra feedback signal from one binary value to its inverse.

7. A computer system for automatically partitioning a specified set of PLA product terms into independent partitioned subsets, comprising:

data processing means for executing software programs;

storage means, coupled to said data processing means, for storing data, said stored data including a specified set of PLA product terms, each PLA product term specifying values for a specified set of binary input signals, and specifying values for a specified set of binary output signals, wherein a subset of said binary output signals are feedback signals used as corresponding ones of said binary input signals; and state dependent partitioning software, executed by said data processing means, said state dependent partitioning software including:

evaluating means for evaluating at least a subset of said feedback signals with respect to predefined criteria and generating a corresponding merit value for each of said feedback signals;

selection means, coupled to said evaluating means, for selecting at least one of said feedback signals in accordance with said generated merit values; and first partitioning means, coupled to said selecting means, for partitioning into partitioned subsets said stored set of PLA product terms in accordance with said specified values of the binary input signals which correspond to said selected feedback signals and for storing said partitioned subsets in said storage means; wherein all of said PLA product terms in each said partitioned subset of PLA product terms have identical input signal values corresponding to said selected feedback signals, and said PLA product terms in different ones of said partitioned subsets have different input signal values corresponding to said selected feedback signals.

8. The computer system of claim 7, wherein said selecting means and first partitioning means repeatedly select feedback signals and partition said PLA product terms until none of said partitioned subsets of PLA product terms contains more than a predefined number of PLA product terms.

9. The computer system of claim 7, wherein
each said specified input signal value in said PLA product terms has a specified value selected from the set consisting of "1", "0" and "don't care"; and
said first partitioning means includes means for generating for each said partitioned subset a copy of each said PLA product term having an input signal value corresponding to one of said selected feedback signals which input signal value is specified to be equal to "don't care", including means for replacing said specified "don't care" input signal value in each said copy of said copied PLA product term with a binary value equal to the value specified for said input signal in all of the other PLA product terms in the same partitioned subset of PLA product terms.

10. The computer system of claim 7, further including:

program loading means for storing control signals, corresponding to said partitioned subsets of PLA product terms, in at least one programmable logic device.

11. The computer system of claim 10, wherein said selecting means and first partitioning means repeatedly select feedback signals and partition said PLA product terms until none of said partitioned subsets of PLA product terms contains more than a predefined number of PLA product terms.

12. The computer system of claim 10, wherein each said specified input signal value in said PLA product terms has a specified value selected from the set consisting of "1", "0" and "don't care"; and said first partitioning means includes means for generating for each said partitioned subset a copy of each said PLA product term having an input signal value corresponding to one of said selected feedback signals which input signal value is specified to be equal to "don't care", including means for replacing said specified "don't care" input signal value in each said copy of said copied PLA product term with a binary value equal to the value specified for said input signal in all of the other PLA product terms in the same partitioned subset of PLA product terms.

13. The computer system of claim 7, wherein each said specified input signal value in said specified set of PLA product terms has a specified value selected from the set consisting of "1", "0" and "don't care";
said merit value generated by said evaluating means for each evaluated feedback signal corresponds to $$(T/2-H)^2+(T/2-Z)^2+(T/2-D)^2$$

where T is the total number of specified product terms, H is the number of said PLA product terms in which an input signal comprising the evaluated feedback signal equals "1", Z is the number of said PLA product terms in which an input signal comprising the evaluated feedback signal equals "0", and D is the number of said PLA product terms in which an input signal comprising the evaluated feedback signal is specified as "don't care".

14. A computer system for automatically partitioning a specified set of PLA product terms into independent partitioned subsets, comprising:
  data processing means for executing software programs;
  storage means, coupled to said data processing means, for storing data, said stored data including a specified set of PLA product terms, each PLA product term specifying values for a specified set of binary input signals, and specifying values for a specified set of binary output signals, wherein a subset of said binary output signals are feedback signals used as corresponding ones of said binary input signals;
  state dependent partitioning software, executed by said data processing means, said state dependent partitioning software including:
    evaluating means for evaluating at least a subset of said feedback signals with respect to predefined criteria and generating a corresponding merit value for each of said feedback signals;
    selection means, coupled to said evaluating means, for selecting at least one of said feedback signals in accordance with said generated merit values; and
    first partitioning means, coupled to said selecting means, for partitioning into partitioned subsets said stored set of PLA product terms in accordance with said specified values of the binary input signals which correspond to said selected feedback signals and for storing said partitioned subsets in said storage means; wherein all of said PLA product terms in each said partitioned subset of PLA product terms have identical input signal values corresponding to said selected feedback signals, and said PLA product terms in different ones of said partitioned subsets have different input signal values corresponding to said selected feedback signals;
    said partitioning means including partition failure determining means for determining when said partitioning means fails to generate partitioned subsets of PLA product terms containing more than a predefined number of PLA product terms; and
  multiple level logic partitioning software, executed by said data processing means when said partitioning failure determining means detects failure of said partitioning means, said multiple level partitioning software including:
    means for adding an extra feedback signal to every one of said PLA product terms, including specifying an extra input signal value and an extra output signal value in every one of said PLA product terms; said specified extra input signal values and output signal values comprising binary values; and
    means for causing said computer system to re-execute said state dependent partitioning software, wherein one of said feedback signals selected by said selecting means in said state dependent partitioning software is said extra feedback signal.

15. The computer system of claim 14, said adding means in said multiple level logic partitioning software including the means for adding to said specified set of PLA product terms at least one additional PLA product term for changing the value of said extra feedback signal from one binary value to its inverse.

16. The computer system of claim 14, further including:
  program loading means for storing control signals, corresponding to said partitioned subsets of PLA product terms, in at least one programmable logic device.

* * * * *